(12) United States Patent
Bernick (10) Patent No.: US 8,500,972 B2
(45) Date of Patent: Aug. 6, 2013

(54) CYLINDRICAL MAGNETRON

(75) Inventor: Mark A. Bernick, White Oak, PA (US)

(73) Assignee: Angstrom Sciences, Inc., Duquesne, PA (US)

(\*) Notice: Subject to any disclaimer, the term of this patent is extended or adjusted under 35 U.S.C. 154(b) by 395 days.

(21) Appl. No.: 12/420,935

(22) Filed: Apr. 9, 2009

(65) Prior Publication Data

US 2009/0260983 A1 Oct. 22, 2009

Related U.S. Application Data

(60) Provisional application No. 61/124,087, filed on Apr. 14, 2008.

(51) Int. Cl.
*C23C 14/3414* (2006.01)
*C23C 14/3407* (2006.01)
*Y02E 30/40* (2006.01)

(52) U.S. Cl.
USPC .................. 204/298.13; 204/298.12; 29/428

(58) Field of Classification Search
USPC ....................... 204/298.22, 298.21
See application file for complete search history.

(56) References Cited

U.S. PATENT DOCUMENTS

| | | |
|---|---|---|
| 5,328,585 A | 7/1994 | Stevenson et al. |
| 5,814,195 A | 9/1998 | Lehan et al. |
| 6,375,814 B1 | 4/2002 | De Bosscher et al. |
| 6,409,897 B1 | 6/2002 | Wingo |
| 6,787,011 B2* | 9/2004 | Ueda et al. ............... 204/298.12 |
| 2003/0136662 A1 | 7/2003 | Ueda et al. |
| 2006/0065524 A1 | 3/2006 | Newcomb et al. |
| 2006/0278519 A1 | 12/2006 | Malaszewski et al. |
| 2007/0007129 A1* | 1/2007 | De Bosscher ............ 204/298.12 |
| 2007/0062809 A1 | 3/2007 | Nolette et al. |
| 2007/0074969 A1* | 4/2007 | Simpson et al. ........... 204/192.1 |
| 2008/0012337 A1* | 1/2008 | De Bosscher et al. ........ 285/411 |
| 2008/0012460 A1 | 1/2008 | Bernick et al. |
| 2009/0152108 A1 | 6/2009 | Huttl et al. |

FOREIGN PATENT DOCUMENTS

| | | |
|---|---|---|
| JP | 57-145983 A | 9/1982 |
| JP | 10-330935 A | 12/1998 |
| KR | 10-2005-0087104 B1 | 8/2005 |
| WO | 2004005574 | 1/2004 |

OTHER PUBLICATIONS http://www.helicoflex.com First posted on Dec. 18, 1996.*

\* cited by examiner

*Primary Examiner* — Emily Le
*Assistant Examiner* — Jenny Wu
(74) *Attorney, Agent, or Firm* — The Webb Law Firm (57) ABSTRACT

A rotatable cylindrical magnetron sputtering device that includes a cathode body defining a magnet receiving chamber and a cylindrical target assembly surrounding the cathode body, wherein the cylindrical target assembly is rotatable around the cathode body. The cylindrical target assembly includes a hollow mandrel and a target portion mounted around and spaced away from the hollow mandrel portion so as to create a space gap between the hollow mandrel and the target portion, wherein the space gap may be greater than 0.002 inch and less than 0.020 inch.

19 Claims, 6 Drawing Sheets

CYLINDRICAL MAGNETRON

CROSS-REFERENCE TO RELATED APPLICATION

This application claims the benefit of U.S. Provisional Application No. 61/124,087, entitled "Cylindrical Magnetron," filed on Apr. 14, 2008, which is hereby incorporated by reference.

BACKGROUND OF THE INVENTION

1. Field of the Invention

This invention relates to a rotatable cylindrical magnetron sputtering apparatus and a related process. More specifically, the invention relates to a cylindrical target assembly for a cylindrical magnetron sputtering device which includes a "floating" target portion where the target portion is metal, metal oxide or ceramic and is not bonded to any backing tube, and which cylindrical target assembly allows the target portion to heat up uniformly and expand, thereby allowing the cylindrical magnetron to operate at increased power levels.

2. Description of Related Art

A typical magnetron sputtering device includes a vacuum chamber having an electrode contained therein, wherein the electrode includes a cathode portion, an anode portion and a target. The term electrode is oftentimes referred to in the industry as a cathode. In operation, a vacuum is drawn in the vacuum chamber followed by the introduction of a process gas into the chamber. Electrical power supplied to the electrode produces an electronic discharge, which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target, which are then deposited upon the substrate. By varying the composition of the target and/or the process gas, a wide variety of substances can be deposited on various substrates. The result is the formation of an ultra-pure thin film deposition of target material on the substrate.

Over the last decade, the cylindrical magnetron has emerged as the leading technology for sputter coating on both rigid and flexible substrates. The rotating cylindrical target surface provides for a constant sputtering surface, thus eliminating the traditional erosion groove and large non-sputtered areas associated with planar targets. Further, the cylindrical target eliminates large areas of dielectric buildup that can lead to arcing, material flaking, debris and other process instabilities.

Transparent conductive coatings are used in a broad variety of devices, which may include Plasma, TFT or LCD televisions, and computer monitors to solar cells, to resistive heating windshields for aircraft and trains, with a broad variety of applications in between. Typically, these transparent conductive coatings are made of indium tin oxide (ITO) or aluminum zinc oxide (AZO) thin films. Further, the majority of these devices have the transparent conductive coatings applied by sputter deposition.

One method of applying ITO and AZO films, in order to obtain the best electrical conductivity and visual transparency, is to apply the coatings to substrates at elevated temperatures, specifically, above 200° C. The problem is that the films can be optically reflective in the infrared spectrum and, therefore, as the film grows in thickness it becomes necessary to continually apply more heat in order to maintain this temperature for the duration of the coating cycle.

Some problems associated with sputtering these ITO or AZO targets are target cracking and the formation of nodules. When a target cracks, there is an increased opportunity for the generation of particulate contamination, as well as arcing on the surface of the target, thereby causing production yield loss. Nodules are known to be sites of impurities which form on the target surface and which may involve inhibiting the quality of the film formation, as well as slowing down the deposition rate, thereby causing yield loss and throughput.

Figure 1:
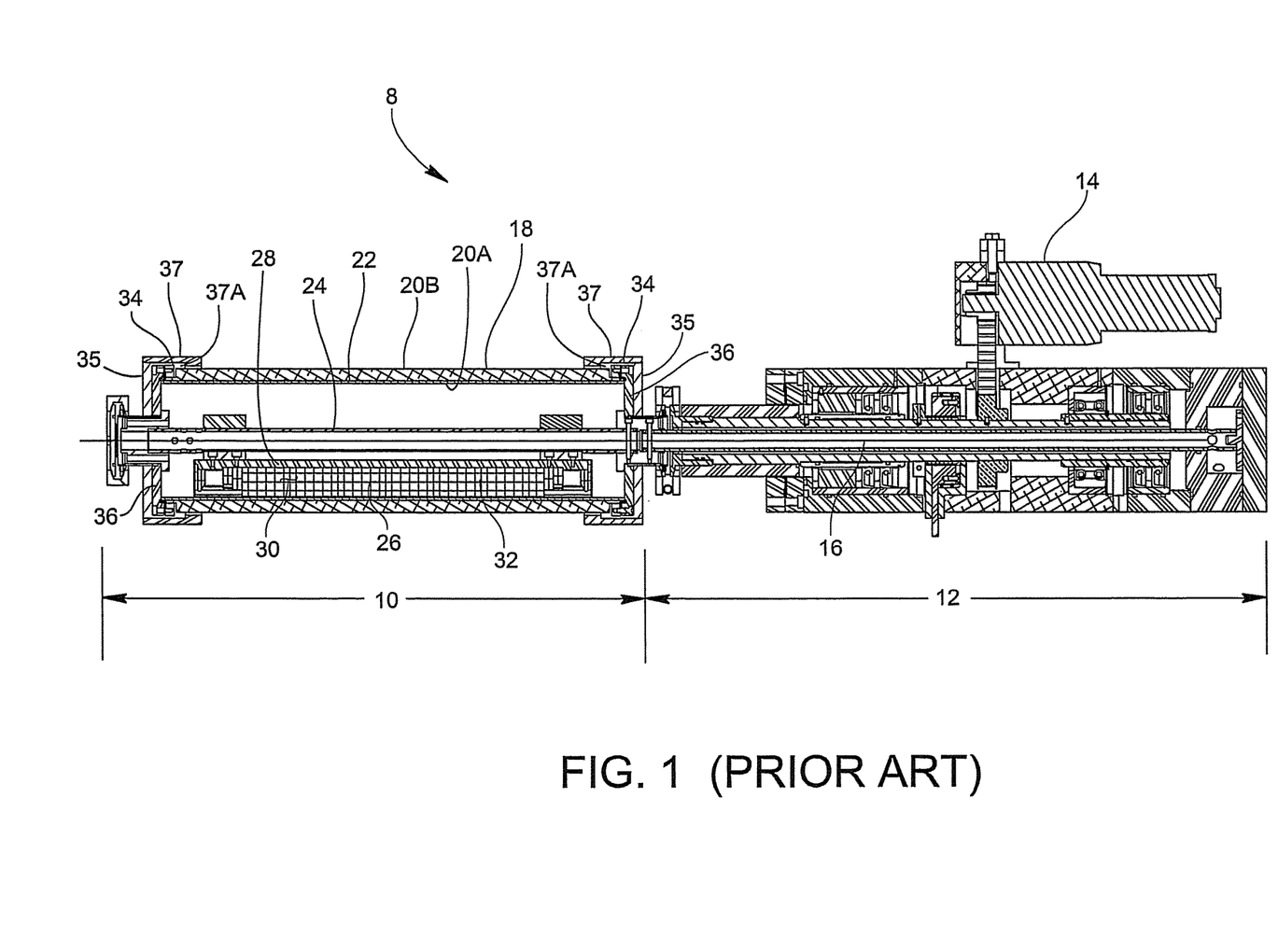
FIG. 1 is a sectional view of a prior art cylindrical magnetron sputtering device.

FIG. 1 shows a prior art rotatable cylindrical magnetron sputtering device 8 that includes a cylindrical target assembly 10 and a drive assembly 12 rotatably connected to the cylindrical target assembly 10, which is similar to that disclosed in United States Patent Application Publication US 2008/0012460 A1 (hereinafter "the '460 publication"), published on Jan. 17, 2008, and which is hereby incorporated herein by reference in its entirety. The drive assembly 12 includes a motor 14 coupled to a drive shaft 16, wherein the drive shaft 16 is rotatably connected to the cylindrical target assembly 10. The structure and operation of the drive assembly 12 including the remaining components for the rotatable cylindrical magnetron sputtering device 8 is anticipated to function similarly to that disclosed in the '460 publication.

Figure 1A:
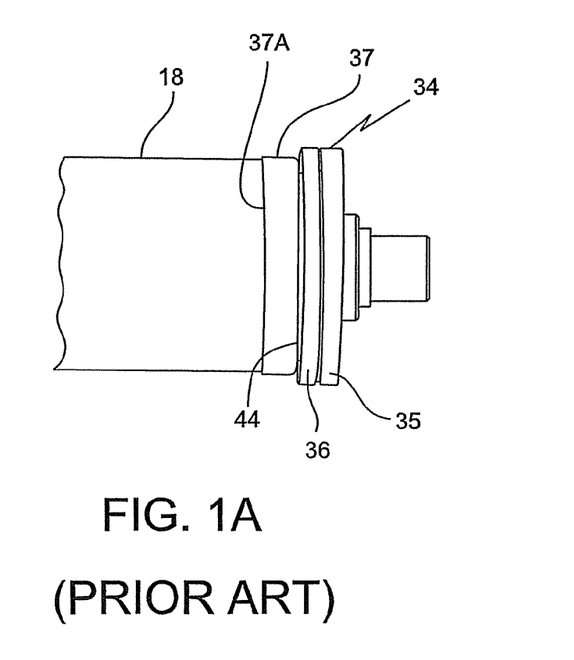
FIG. 1A is an enlarged view of a retaining assembly of the prior art cylindrical target assembly shown in FIG. 1.

Referring to FIGS. 1 and 1A, the cylindrical target assembly 10 includes a hollow cylindrical target 18 having an inner surface 20A and an outer surface 20B, a backing tube 22 bonded to the inner surface 20A of the target 18. The assembly 10 further includes a central member 24 such as a shaft or sleeve received within the cylindrical target 18, a cathode body 26 having a base plate 28 attached thereto, wherein the base plate 28 is attached to the central member 24 for supporting the cathode body 26. Attachment of the base plate 28 to the central member 24 may be accomplished using a clamp or any other suitable clamping arrangement known in the art. A magnet receiving chamber 30 is defined in the cathode body 26, wherein a magnet arrangement 32 is received within the magnet receiving chamber 30. The cylindrical target 18 and the attached backing tube 22 is held in place by an annular target retaining assembly 34 (such as a clamp arrangement) on each end thereof, which is in communication with the drive assembly 12, such that the drive assembly 12 is adapted to rotate the cylindrical target assembly 10 around the cathode body 26 and to introduce high current power into the drive shaft 16 when the shaft 16 is rotating. The retainer assembly 34 may include an end cap 35 rotatably connected to a clamping member 36, wherein the clamping member 36 has a step portion 37 defining a recess 37A therein for receiving the target 18. The retainer assembly 34 may also include any other suitable clamping arrangement known in the art.

In order to promote long target life without target cracking, it is the present practice to mechanically bond the cylindrical target 18 to the backing tube 22 as shown in FIG. 1. The backing tube 22 is typically made of copper with the goal of removing a sufficient amount of heat during the sputtering process. The bonding agent used is typically indium or an indium alloy. This practice is both costly and time consuming. In order to reduce the formation of nodules, it is known to attempt to sputter etch the largest area of the target surface as possible so that the nodules are cleaned or etched away before they have a chance to form. Also, to maintain the production rate, it is necessary to stock an extra supply of bonded targets on extra backing tubes, which can be used when the first set is sent out to the vendors for removal and reclamation of the unused ITO and for re-bonding of a new target.

There is, therefore, a need in the art to develop a device and process which allows the target to heat up uniformly and to sputter at powers and rates much higher than traditionally accepted, which eliminates the formation of nodules and the need to bond the target to a backing tube, and which results in a resistance to the cracking of the target.

It is, therefore, desirable to provide a cylindrical magnetron sputtering device which includes a cylindrical target assembly which may be adapted to decrease the amount of heat transferred to the target, while still allowing the magnetic fields to travel to the target for the sputtering of the target against a substrate.

It is further desirable to provide a cylindrical target assembly wherein the target is not bonded to the backing tube, nor does it have direct mechanical contact with the backing tube such that the target may be changed quickly resulting in increased production rates, and the same backing tube may be used for several replaced targets.

SUMMARY OF THE INVENTION

The present invention provides a cylindrical target assembly for use in a rotatable cylindrical magnetron sputtering device. The rotatable cylindrical magnetron sputtering device includes a cathode body defining a magnet receiving chamber and a cylindrical target assembly surrounding the cathode body, wherein the cylindrical target assembly is rotatable around the cathode body. The cylindrical target assembly includes a hollow mandrel and a target portion mounted around and spaced away from the hollow mandrel portion so as to create a space gap between the hollow mandrel and the target portion, wherein the space gap may be greater than 0.002 inch and less than 0.020 inch.

DETAILED DESCRIPTION OF THE INVENTION

Figure 2:
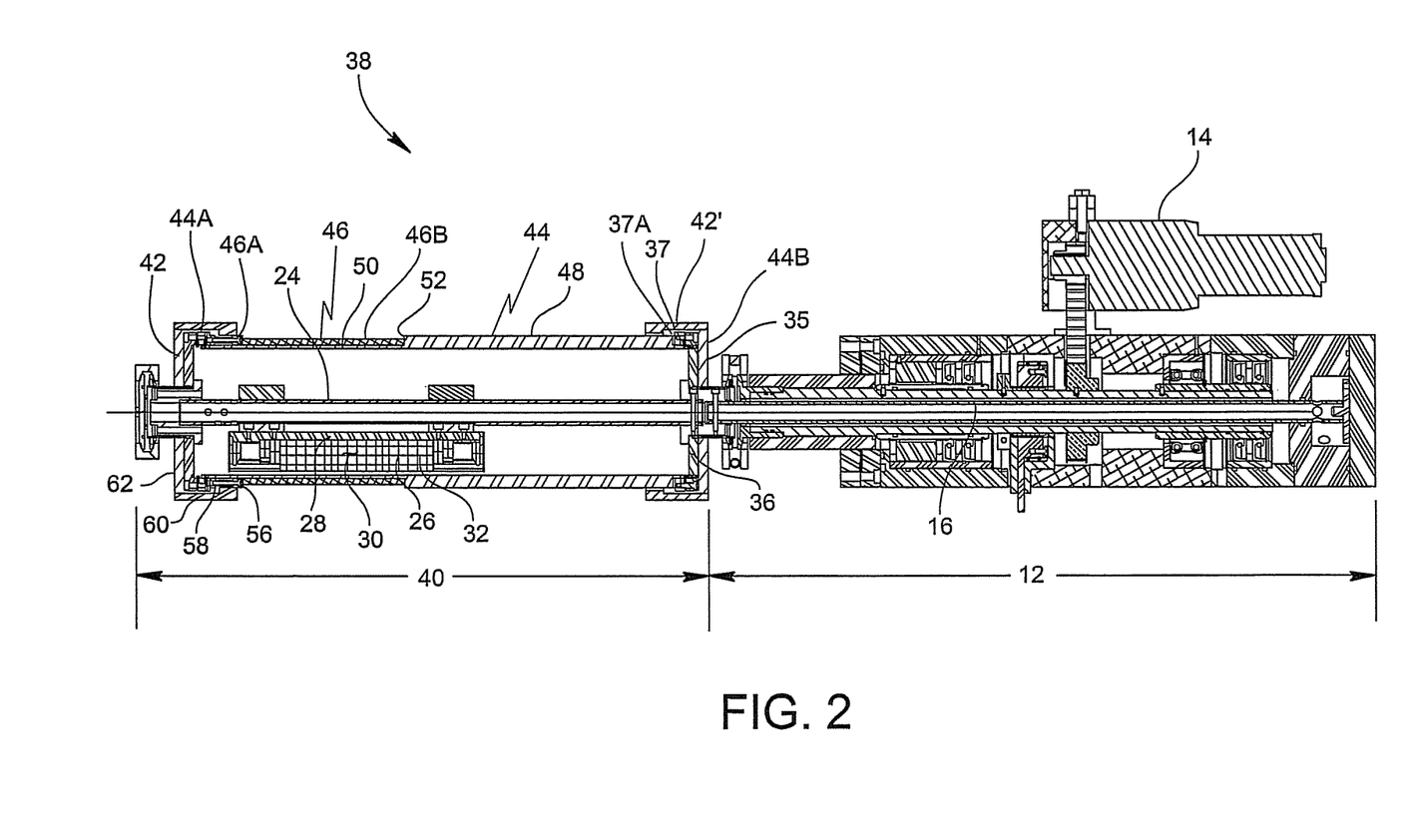
FIG. 2 is a sectional view of a first embodiment of a cylindrical target assembly for use in a cylindrical magnetron sputtering device.

Referring to FIG. 2, the present invention provides for a rotatable cylindrical magnetron sputtering device 38 that is similar to the device 8 shown in FIG. 1 and in the '460 publication, except for the difference noted below. Like reference numerals are used for like parts. The cylindrical magnetron sputtering device 38 includes a cylindrical target assembly 40 coupled to a drive assembly 12. The cylindrical target assembly 40 may replace the prior art cylindrical target assembly 10 shown in FIG. 1, in which the drive assembly 12 is used to rotate the cylindrical target assembly 40. Other drive assemblies commonly used in cylindrical magnetron sputtering devices may also be used to rotate the cylindrical target assembly 40. It is to be appreciated that the rotatable cylindrical magnetron sputtering device 38 of the present invention may be used in conjunction with commonly used power supplies, including AC, DC, and pulsed DC power supplies.

Referring to FIGS. 2-5, the cylindrical target assembly 40 includes a retaining assembly 42, 42' on each end thereof, respectively, a backing tube or hollow mandrel 44 and a target portion 46. The target portion 46 is mounted around and spaced away from the hollow mandrel 44 and is secured to the hollow mandrel 44 for rotation therewith via the retaining assembly 42. In an embodiment of the invention, the backing tube or hollow mandrel 44 may be a non-magnetic material, such as, for example, aluminum, stainless steel, copper or titanium, and the target portion 46 may be a ceramic portion or a metal oxide portion, such as indium tin oxide (ITO) or aluminum zinc oxide (AZO).

Figure 3:
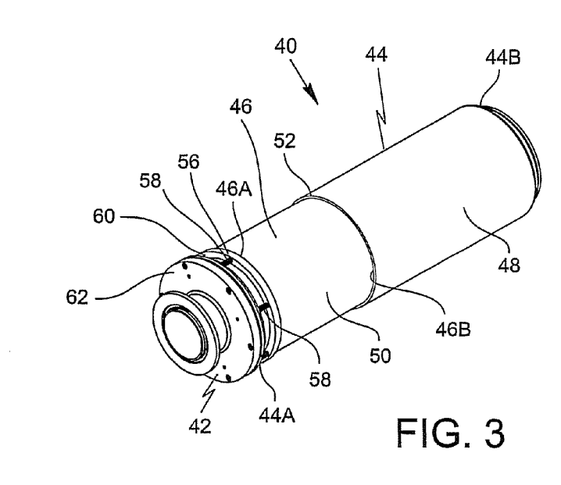
FIG. 3 is a perspective view of the cylindrical target assembly shown in FIG. 2.
Figure 4:
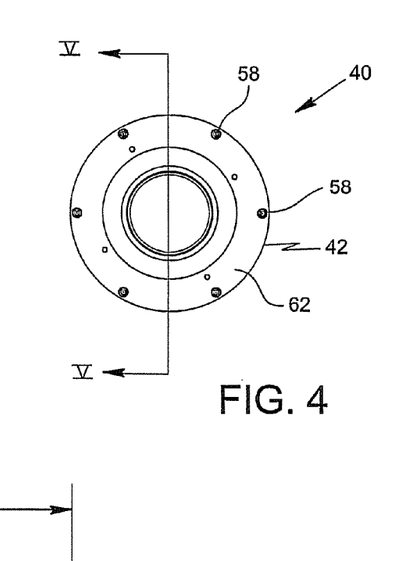
FIG. 4 is a front elevational view of the cylindrical target assembly shown in FIG. 3.
Figure 5:
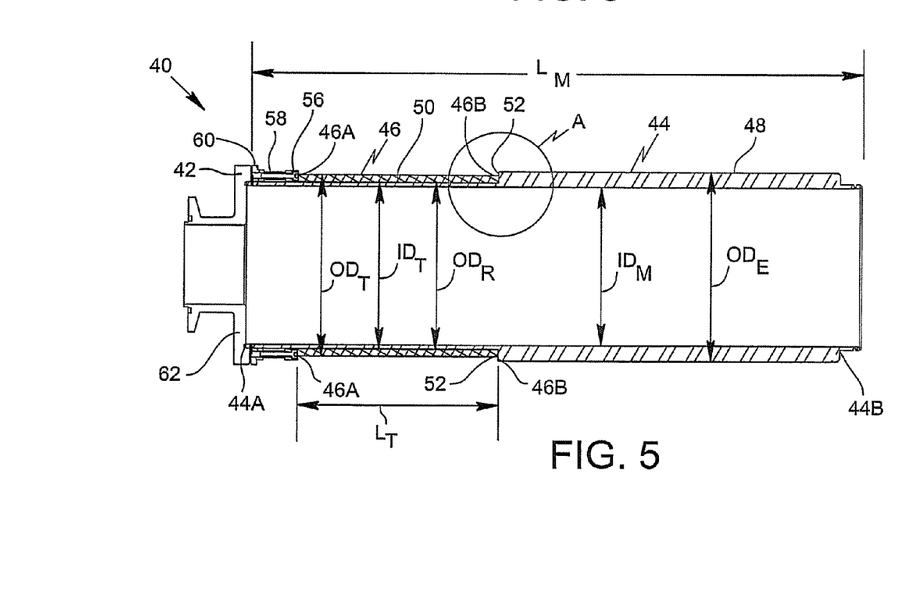
FIG. 5 is a sectional view of the cylindrical target assembly shown in FIG. 4 taken along lines V-V.

Referring to FIGS. 3-5, the hollow mandrel 44 having a first end 44A and a second end 44B is cylindrical in shape and has a constant inner diameter $ID_M$ throughout its length $L_M$. The hollow mandrel 44 also includes an enlarged diameter area 48 and a reduced diameter area 50, wherein the outer diameter $OD_E$ of the enlarged diameter area 48 is greater than the outer diameter $OD_R$ of the reduced diameter area 50. The demarcation between the enlarged diameter area 48 and the reduced diameter area 50 forms a shoulder indicated at reference number 52. Additionally, a shoulder 52 may also be formed by clamping a ring (not shown) around the hollow mandrel 44 similar to that of the step portion 37 of the clamping member 36 of the retaining assembly 34 shown in FIGS. 1 and 1A. Typically, the target portion 46 is co-axial with the reduced diameter area 50 of the hollow mandrel 44.

With continued reference to FIGS. 3-5, the target portion 46 having a first end 46A and a second end 46B is also cylindrical in shape and is mounted around the outer diameter $OD_R$ of the reduced diameter area 50 of the hollow mandrel 44. The second end 44B of the hollow mandrel 44 is rotatably connected to the drive assembly 12 for rotation therewith via the retaining assembly 42' as shown in FIG. 2. The retaining assembly 42' is similar to the prior art retaining assembly 34 shown in FIGS. 1 and 1A. The target portion 46 is held in position at the first end 46A via the retaining assembly 42, whereby the second end 46B of the target portion 46 abuts against shoulder 52. The target portion 46 has an inner diameter $ID_T$ that is greater than the outer diameter $OD_R$ of the reduced diameter area 50 of the hollow mandrel 44 such that a space gap or insulation layer 54 (shown in FIG. 5A) is formed between the inner diameter $ID_T$ and the outer diameter $OD_R$ of the reduced diameter area 50 of the hollow mandrel 44.

Figure 5A:
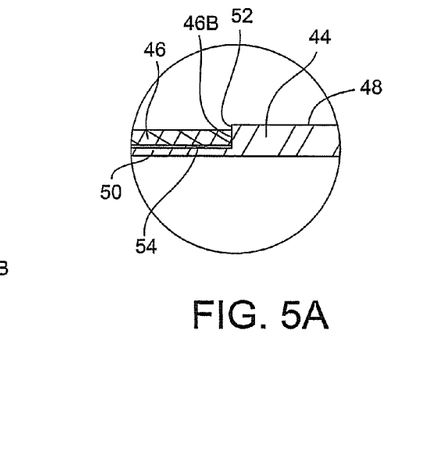
FIG. 5A is an exploded view of section A of the cylindrical target assembly shown in FIG. 5.
Figure 6:
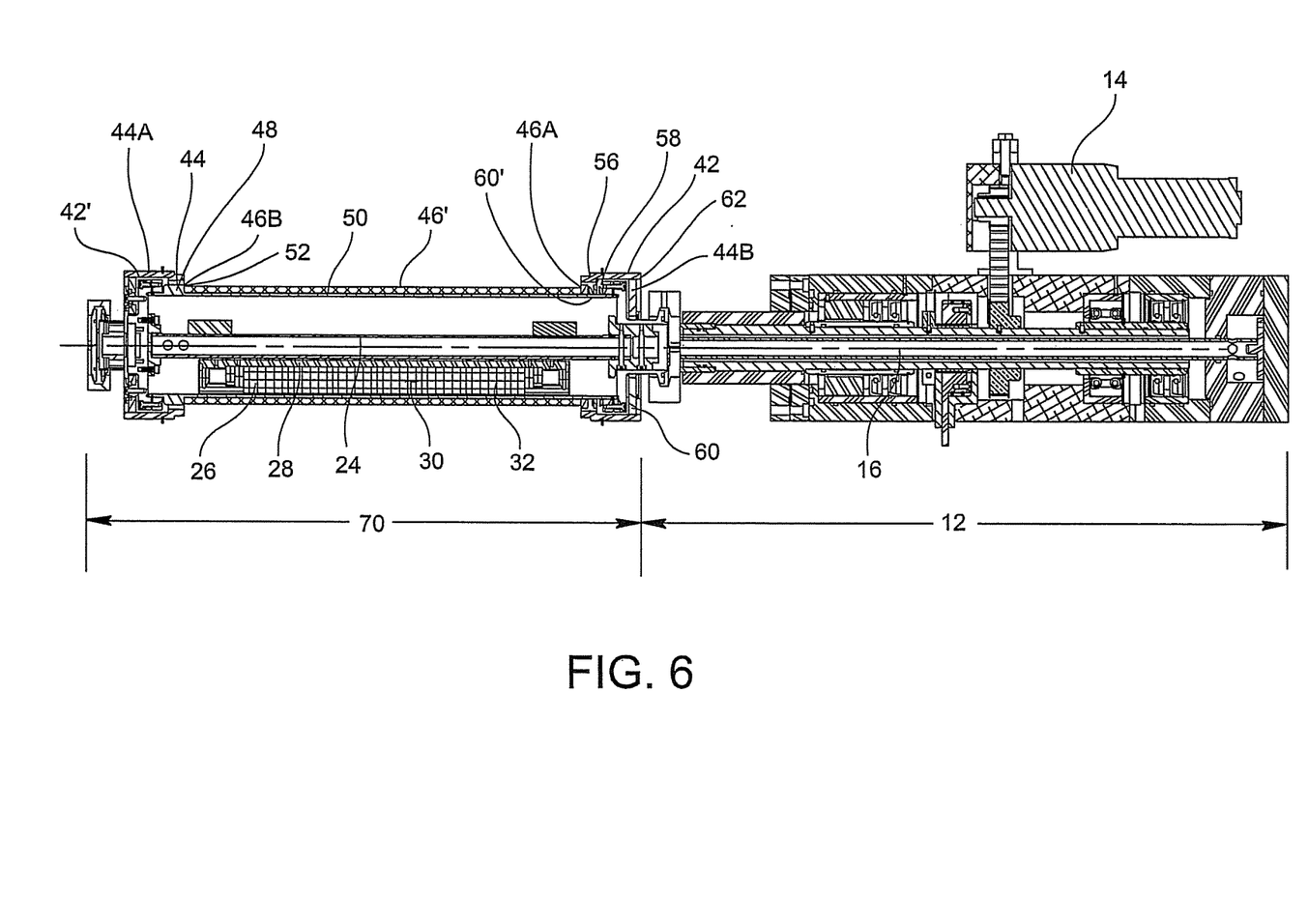
FIG. 6 is a sectional view of a second embodiment of a cylindrical target assembly for use in a cylindrical magnetron sputtering device.
Figure 7:
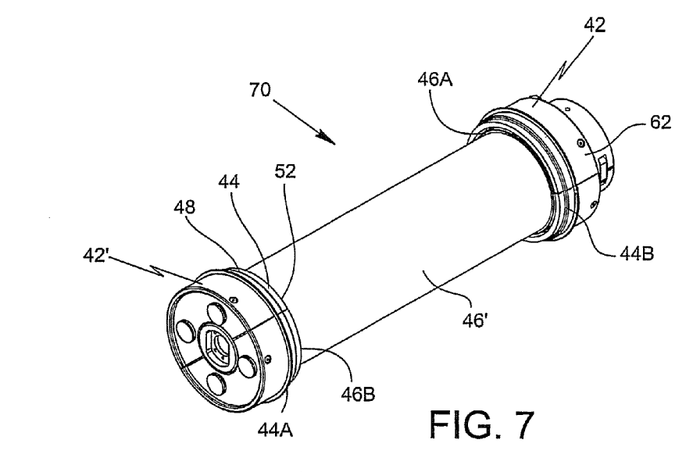
FIG. 7 is a perspective view of the cylindrical target assembly shown in FIG. 6.
Figure 8:
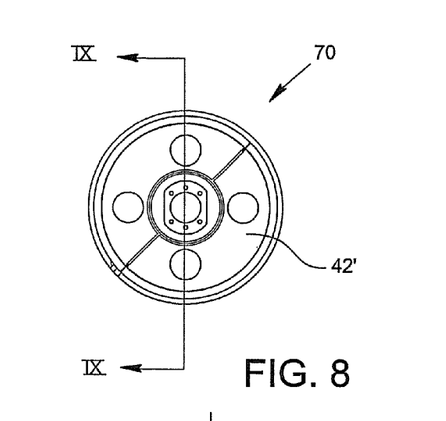
FIG. 8 is a front elevational view of the cylindrical target assembly shown in FIG. 7.

Still referring particularly to FIGS. 5 and 5A, the target portion 46 also includes an outer diameter $OD_T$ that is less than the outer diameter $OD_E$ of the enlarged diameter area 48 for the abutting of the second end 46B of the target portion 46 against the shoulder 52 of the hollow mandrel 44. As is also apparent in FIG. 5, the length $L_T$ of target portion 46 is less than the length $L_M$ of the hollow mandrel 44. The space gap or insulation layer 54 formed between the outer diameter $OD_R$ of the reduced diameter area 50 of the hollow mandrel 44 and the inner diameter $ID_T$ of the target portion 46 may act as an insulation layer between the reduced diameter area 50 of hollow mandrel 44 and target portion 46. Typically, this space gap 54 should be several thousands of an inch, for example, greater than 0.002 inch and less than 0.020 inch and preferably, about 0.005 inch, between the outer diameter $OD_R$ of the reduced diameter area 50 of the hollow mandrel 44 and the inner diameter $ID_T$ of the target portion 46.

In an embodiment of the invention, preferably, the hollow mandrel 44 is made of a material that is a conductor of heat and electricity, for example, aluminum, and the space gap 54 may prevent heat from traveling from the hollow mandrel 44 to the target portion 46 while still allowing electricity or the magnetic fields of the magnet arrangement 32 within the hollow mandrel 44 to be created around the outer diameter $OD_T$ of the target portion 46 for the sputtering of the target portion 46 against a substrate according to the disclosure of the above-discussed '460 publication, for example.

Referring to FIGS. 2-5, the target portion 46 of the cylindrical target assembly 40 is mounted around the reduced diameter portion 50 of the hollow mandrel 44 via the retaining assembly 42 which is positioned at the first end 46A of the target portion 46 and at a first end 44A of the hollow mandrel 44. The retaining assembly 42 includes a compression ring 56 positioned around the reduced diameter area 50 of the first end 44A of the hollow mandrel 44 and in contact with the first end 46A of the target portion 46; a plurality of spaced apart biasing members 58 arranged circumferentially around the cylindrical target assembly 40 at the first end 46A of the target portion 46 and abutting the compression ring 56; a spacing ring 60 positioned circumferentially around the hollow mandrel 44 of the cylindrical target assembly 40 and abutting the plurality of biasing members 58; and an end cap 62 abutting the spacing ring 60 and positioned adjacent the first end 46A of the target portion 46 of the cylindrical target assembly 40. The biasing members 58 may include compression springs such as coil springs (shown in FIG. 5), wave springs (shown in FIGS. 9 and 9A) or thrust washers (not shown). The construction of the retaining assembly 42 is such that the second end 46B of the target portion 46 is forced tightly against the shoulder 52 and securely fastened around the hollow mandrel 44 while still retaining an appropriate space for the space gap 54 so that the target portion 46 remains sufficiently spaced away from the outer diameter $OD_R$ of the reduced area 50 of the hollow mandrel 44.

Under certain circumstances, it is also anticipated that due to thermal expansion, the length $L_T$ of the target portion 46, especially if the target portion 46 is ceramic or ITO or AZO material, would expand and tend to push away from the neighboring target material. Generally, this is not much of an issue during the initial operation of the cylindrical target assembly 40; however, if the sputtering process were interrupted, thereby allowing the ITO material of the target portion 46 to cool, the target portion 46 would tend not to return to its initial positioning tightly against shoulder 52, thus leaving a gap between the shoulder 52 of the hollow mandrel 44 and the second end 46B of the target portion 46. Because the retaining assembly 42 is spring loaded, the retaining assembly 42 produces a constant biasing force against the first end 46A of the target portion 46 to assure that there is no gap existing between the shoulder 52 and the second end 46B of the target portion 46. It is also to be appreciated that, in some instances, the spring loaded retaining assembly 42 may not be necessary. However, if the cylindrical target assembly 40 is positioned horizontally during sputtering, then the use of the spring loaded retaining assembly 42 is preferred.

Referring to FIG. 2, the present invention also provides for a method or process for enhancing the operation of the cylindrical target assembly 40 for applying a conductive coating to a substrate by sputter deposition. The method includes the steps of providing the cylindrical target assembly 40 (as previously discussed) for rotation around a cathode body 26, wherein the cathode body 26 extends a portion of the length $L_M$ of the hollow mandrel 44, for example, a length extending from the first end 46A to the second end 46B of the target portion 46. Next, the target portion 46 is mounted around and spaced away from a portion of the hollow mandrel 44, wherein a space gap 54 is defined between the portion of the hollow mandrel 44 and the target portion 46. Further, the target portion 46 is secured to the hollow mandrel 44, wherein the second end 46B of the target portion 46 abuts against a shoulder 52 and the first end 46A is retained for rotation with the hollow mandrel 44 optionally via the retaining assembly 42. When applying a conductive coating to a substrate by sputter deposition the cylindrical target assembly 40 is spaced away from the substrate (not shown). The substrate may be arranged relative to the cylindrical target assembly 40 in a manner well-known to those skilled in the art.

One of the advantages of the present invention is that the target portion 46 does not continuously contact the backing tube or hollow mandrel 44. It is believed that this allows the target portion 46 to heat up uniformly, which then allows the cylindrical magnetron device to be operated two to three times faster than the typical power levels of the prior art. This increase in power levels would, in effect, result in an increased production rate ranging from two to three times greater than the production rates for similar cylindrical magnetron devices of the prior art.

It is further envisioned that the present invention would result in the elimination or lessening of module formation within the erosion track, which generally causes contamination of the film on the substrate and, therefore, loss of target utilization. The invention also is envisioned to allow for a simple and quick change of the target portion 46 since there is no bonding of the target portion 46 to the backing tube or hollow mandrel 44, thus resulting in a significant cost savings per target portion 46.

Figure 9:
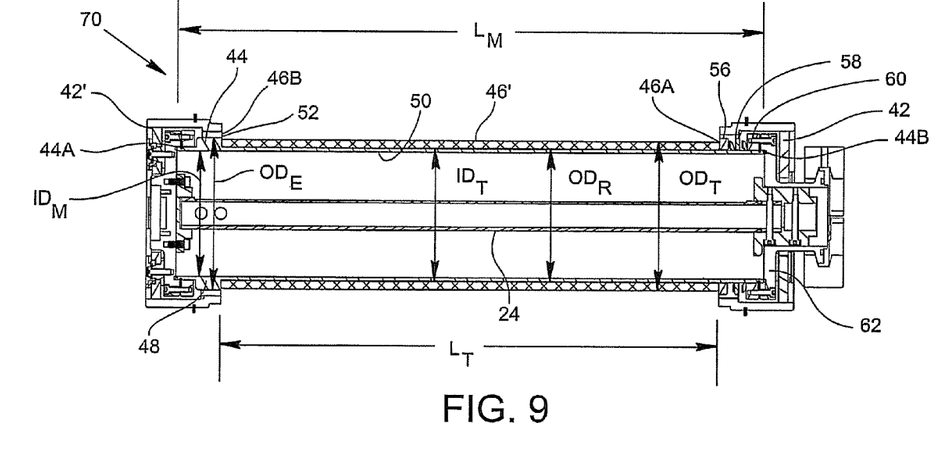
FIG. 9 is a sectional view of the cylindrical target assembly shown in FIG. 8 taken along lines IX-IX.
Figure 9A:
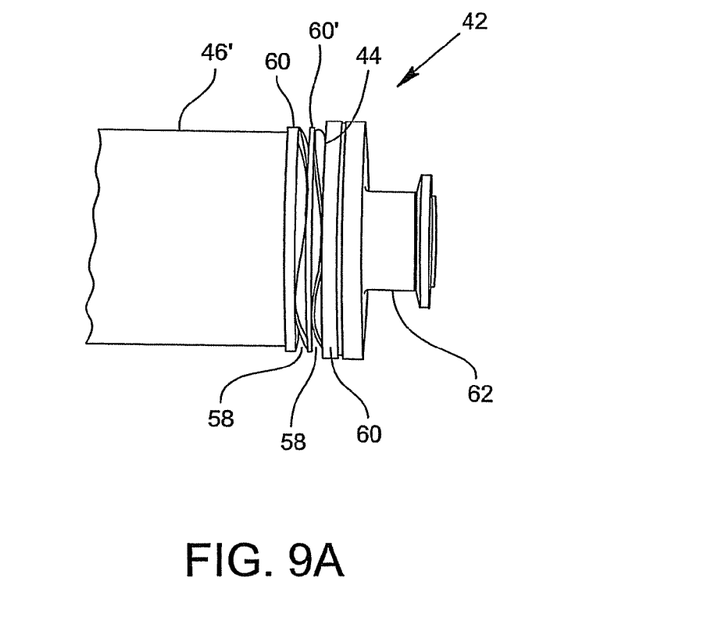
FIG. 9A is an enlarged view of a retaining assembly of the cylindrical target assembly shown in FIG. 9.

Referring to FIGS. 6-9, the present invention provides for a second embodiment of a cylindrical target assembly 70, that is similar to the target assembly 40, except for the differences noted below. Like reference numerals are used for like parts. The target assembly 70 also includes a retaining assembly 42, 42' on each end thereof, a backing tube or hollow mandrel 44 and a target portion 46'. A difference between the cylindrical target assembly 40 and target assembly 70 is that the retaining assembly 42 is adjacent the second end 44B and the shoulder 52 is adjacent the first end 44A of the hollow mandrel 44 and includes an additional spacing ring 60' defined between the biasing members 58 (wave springs) as shown in FIG. 9A. As shown in FIG. 9, the length $L_T$ of the target portion 46' is only slightly less than the length $L_M$ of the hollow mandrel 44. For example, the length $L_T$ of the target portion 46' may be approximately one inch less than the length $L_M$ of the hollow mandrel 46'. In this embodiment, the length of the cathode body may be increased such that a larger target portion may be sputtered during the deposition process.

EXAMPLE

A test was run for the cylindrical target assembly 40 of the invention. A single cylinder of indium tin oxide (ITO) target 46 was used against an aluminum hollow mandrel or backing tube 44. The cathode body 26 was about 19 inches in length but only 6 inches of an ITO target cylinder was used so the rest of the target was aluminum. The goal of the test was to determine if the cylindrical target assembly 40 had the structural integrity to withstand the process environment (sputtering) without chipping, breaking or forming nodules. The test ran for more than eight days, 24 hours a day, with only intermittent breaks for inspecting the target portion 46 for any anomalies or non-conformities. The test included operation of the cylindrical target assembly 40 at power levels greater than 2.5 times those applied to bonded cylindrical ITO systems or to bonded planar ITO systems. The results of this test indicated no signs of damage to the target portion 46 associated with the sputtering process, regardless of the power levels, and no nodule formations were found. It has even been found that at accelerated power levels, i.e., two times or higher, the traditional power applied to similar bonded targets, there was a significant increase in the deposition rate from the surface of the target portion 46 in contrast to sputtering of a bonded target assembly at equivalent power levels. Further, rotation of the target assembly 40 at high speeds (typically higher than 10 rpm, but lower speeds can be used) may allow the target portion 46 to rise in temperature uniformly so that there is no thermal gradient across the material.

Further, by using a non-bonded ITO target and allowing the ITO target to rise to accelerated temperatures, the target itself may become a source of heating the substrate which will improve the quality of the ITO films and eliminate the need for additional heating in order to overcome the reflective nature of the formed thin film. Also, the ITO cylinders may be fully reclaimed. That is, the target portion can easily slide off the backing tube and a new target portion may be easily installed, thereby eliminating the need for spare backing tubes thus eliminating the time required for bonding new targets onto backing tubes and shipping these assemblies to the customers.

It is to be further appreciated that the target portion 46 or 46' may be inclusive of electrically conductive metal oxide, nitride or metal suboxide or metal subnitride targets. Also, the space gap 54 may contain a vacuum or air.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the intended claims and any and all equivalents thereof.

The invention claimed is:

1. A cylindrical target assembly for use in a rotatable cylindrical magnetron sputtering device, the assembly comprising:
   a hollow mandrel;
   a target portion mounted around and spaced away from the hollow mandrel wherein a space gap is defined between the hollow mandrel and the target portion and wherein the target portion has a first end and a second end;
   wherein the hollow mandrel and the target portion are cylindrical in shape;
   wherein the target portion is mounted around the hollow mandrel;
   wherein the target portion is retained for rotation with the hollow mandrel via a retaining assembly located at one end of the target portion;
   wherein the hollow mandrel comprises a first end with a reduced diameter portion and an enlarged diameter portion spaced therefrom thereby forming a shoulder therebetween, and wherein the target portion is mounted around the reduced diameter portion of the hollow mandrel such that a first end of the target portion abuts with the shoulder; and
   wherein the retaining assembly is comprised of a clamping member that slidably fits around an end of the hollow mandrel and wherein the retaining assembly comprises a spring that is axially urged against the other end of the target portion to exert a constant compressive axial biasing force along the entire length of the target portion, such that the second end of the target portion is resiliently forced against the shoulder of the hollow mandrel to secure the target portion upon the hollow mandrel.

2. The assembly of claim 1, wherein the space gap is greater than 0.002 inches and less than 0.020 inches.

3. The assembly of claim 1, wherein the hollow mandrel includes an aluminum portion and wherein the target portion includes a ceramic portion.

4. The assembly of claim 3, wherein the aluminum portion is a backing tube and wherein the ceramic portion is selected from the group consisting of an indium tin oxide target and an aluminum zinc oxide target.

5. The assembly of claim 4, wherein the backing tube comprises aluminum, stainless steel, copper or titanium.

6. The assembly of claim 1, wherein the target portion is adapted to be rotatable with the hollow mandrel.

7. The assembly of claim 1, wherein the target portion has an inner diameter and the reduced diameter portion of the hollow mandrel has an outer diameter; and wherein the inner diameter of the target portion is greater than the outer diameter of the reduced diameter portion of the hollow mandrel so as to create the space gap between the inner diameter of the target portion and the outer diameter of the reduced diameter portion of the hollow mandrel.

8. The assembly of claim 1, wherein the retaining assembly is comprised of:
   the compression ring positioned around the hollow mandrel at one end of the hollow mandrel and in contact with the other end of the target portion;
   a plurality of biasing members arranged around the circumference of the hollow mandrel at the other end of the target portion and abutting the compression ring;
   a spacing ring positioned around the circumference of the hollow mandrel and abutting the plurality of biasing members; and
   a clamp abutting the spacing ring and positioned on the one end of the target portion of the cylindrical target assembly.

9. The assembly of claim 8, wherein the plurality of biasing members comprises compression springs or wave springs.

10. A rotatable cylindrical magnetron sputtering device comprising:
   a cathode body defining a magnet receiving chamber, wherein a magnet arrangement is received with the magnet receiving chamber;
   a cylindrical target assembly surrounding the cathode body, the cylindrical target assembly comprises a hollow mandrel and a target portion mounted around and spaced away from the hollow mandrel wherein a space gap is defined between the hollow mandrel and the target portion;
   a drive assembly in communication with the cylindrical target assembly, wherein the cylindrical target assembly is rotatable around the cathode body wherein the target portion is retained for rotation with the hollow mandrel via a retaining assembly located at a first end of the target portion; and wherein the hollow mandrel comprises a first end with a reduced diameter portion and an enlarged diameter portion spaced therefrom thereby forming a shoulder therebetween, and wherein the target portion is mounted around the reduced diameter portion of the hollow mandrel such that the first end of the target portion abuts with the shoulder; and wherein the retaining assembly is comprised of a clamping member that slidably fits around an end of the hollow mandrel and wherein the retaining assembly comprises a spring that is axially urged against the other end of the target portion to exerts a constant compressive axial biasing force along the entire length of the target portion, such that the second end of the target portion is resiliently forced against the shoulder of the hollow mandrel to secure the target portion upon the hollow mandrel.

11. The device of claim 10, wherein the space gap is greater than 0.002 inches and less than 0.020 inches.

12. The device of claim 10, wherein the hollow mandrel comprises an aluminum portion and wherein the target portion comprises a ceramic portion selected from the group consisting of an indium tin oxide target and an aluminum zinc oxide target.

13. The device of claim 12, wherein the ceramic portion of the cylindrical target assembly is adapted to be rotatable with the aluminum portion.

14. The device of claim 12, wherein the ceramic portion is secured to the cylindrical target assembly for rotation therewith via a retaining assembly.

15. The device of claim 14, wherein the retaining assembly is adapted to exert a biasing force against an end of the ceramic portion such that no gap exists between an opposite end of the ceramic portion and aluminum portion of the hollow mandrel.

16. A process for enhancing the operation of a cylindrical target assembly, the steps comprising:

providing the cylindrical target assembly for rotation around a cathode body, wherein the cylindrical target assembly comprises a hollow mandrel and a target portion;

mounting the target portion around a portion of the hollow mandrel, wherein the target portion is spaced away from the hollow mandrel so as to create a space gap between the hollow mandrel and the target portion;

securing the target portion of the cylindrical target assembly onto the hollow mandrel such that the target portion rotates with the hollow mandrel;

retaining the target portion for rotation with the hollow mandrel via a retaining assembly located at a first end of the target portion;

wherein the hollow mandrel comprises a first end with a reduced diameter portion and an enlarged diameter portion spaced therefrom thereby forming a shoulder therebetween, and wherein the target portion is mounted around the reduced diameter portion of the hollow mandrel such that the first end of the target portion abuts with the shoulder; and wherein the retaining assembly is comprised of a clamping member that slidably fits around an end of the hollow mandrel and wherein the retaining assembly comprises a spring that is axially urged against the other end of the target portion to exerts a constant compressive axial biasing force along the entire length of the target portion, such that the second end of the target portion is resiliently forced against the shoulder of the hollow mandrel to secure the target portion upon the hollow mandrel.

17. The process of claim 16, wherein the target portion is secured to the cylindrical target assembly for rotation therewith via a retaining assembly.

18. The process of claim 16, wherein the space gap is greater than 0.002 inches and less than 0.020 inches.

19. The process of claim 16, wherein a portion of the hollow mandrel comprises aluminum, stainless steel, copper or titanium.

* * * * *

UNITED STATES PATENT AND TRADEMARK OFFICE
CERTIFICATE OF CORRECTION

PATENT NO.       : 8,500,972 B2                                    Page 1 of 1
APPLICATION NO.  : 12/420935
DATED            : August 6, 2013
INVENTOR(S)      : Mark A. Bernick

It is certified that error appears in the above-identified patent and that said Letters Patent is hereby corrected as shown below:

In the Claims

Column 9, Line 15, Claim 10, delete "exerts" and insert -- exert --

Column 10, Line 26, Claim 16, delete "exerts" and insert -- exert --

Signed and Sealed this
Seventh Day of January, 2014

Margaret A. Focarino
*Commissioner for Patents of the United States Patent and Trademark Office*